(12) United States Patent
Cui et al.

(10) Patent No.: US 9,189,053 B2
(45) Date of Patent: Nov. 17, 2015

(54) PERFORMANCE BASED POWER MANAGEMENT OF A MEMORY AND A DATA STORAGE SYSTEM USING THE MEMORY

(71) Applicant: Freescale Semiconductor, Inc., Austin, TX (US)

(72) Inventors: Jing Cui, Tianjin (CN); Shayan Zhang, Austin, TX (US); Yunwu Zhao, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/493,353

(22) Filed: Sep. 23, 2014

(65) Prior Publication Data

US 2015/0160718 A1 Jun. 11, 2015

(30) Foreign Application Priority Data

Dec. 6, 2013 (CN) .......................... 2013 1 0654610

(51) Int. Cl.
| | |
|---|---|
| *G06F 1/32* | (2006.01) |
| *G06F 11/07* | (2006.01) |
| *H03L 7/00* | (2006.01) |
| *H03K 3/03* | (2006.01) |
| *G06F 3/06* | (2006.01) |

(52) U.S. Cl.
CPC ............ *G06F 1/3203* (2013.01); *G06F 1/3275* (2013.01); *G06F 11/07* (2013.01); *G06F 3/065* (2013.01); *H03K 3/0315* (2013.01); *H03L 7/00* (2013.01)

(58) Field of Classification Search
CPC ..... G06F 1/3203; G06F 3/065; G06F 3/0619; G06F 11/1402; G06F 17/30088; G06F 3/0688; H03L 7/00; H03K 3/0315; G11C 5/141; G11C 5/143; G11C 5/147; G11C 7/22; G11C 11/413
See application file for complete search history.

(56) References Cited

U.S. PATENT DOCUMENTS

| | | | |
|---|---|---|---|
| 5,566,121 A  * | 10/1996 | Hadderman et al. .......... | 365/222 |
| 5,901,103 A | 5/1999 | Dunn et al. | |
| 7,254,724 B2 | 8/2007 | Payne | |
| 7,437,585 B2 | 10/2008 | Nakano et al. | |
| 7,493,506 B2 | 2/2009 | Balasubramanian et al. | |
| 7,603,578 B2 | 10/2009 | Balasubramanian et al. | |
| 7,924,650 B2 | 4/2011 | Cho et al. | |
| 8,156,357 B2 | 4/2012 | Zhang et al. | |
| 2008/0215903 A1* | 9/2008 | Payne ............................ | 713/322 |
| 2008/0307240 A1 | 12/2008 | Dahan et al. | |
| 2012/0030482 A1 | 2/2012 | Russell et al. | |
| 2013/0047012 A1* | 2/2013 | Jung ............................. | 713/320 |
| 2013/0249610 A1* | 9/2013 | Hara ............................. | 327/159 |
| 2014/0189401 A1* | 7/2014 | Keppel et al. ................. | 713/323 |
| 2014/0281307 A1* | 9/2014 | Peterson et al. .............. | 711/162 |

* cited by examiner

*Primary Examiner* — Richard Elms
*Assistant Examiner* — Ajay Ojha
(74) *Attorney, Agent, or Firm* — Charles Bergere; Shayan Zhang

(57) ABSTRACT

Power control circuitry for a data processor supplies a memory array with a supply voltage corresponding to a memory performance level. The performance levels include a full performance level and a power-saving performance level. Voltage sensing circuitry senses a voltage level of the memory array and outputs a power status signal. The power status signal is used to determine when the memory array is awake and can be accessed.

17 Claims, 9 Drawing Sheets

PERFORMANCE BASED POWER MANAGEMENT OF A MEMORY AND A DATA STORAGE SYSTEM USING THE MEMORY

BACKGROUND OF THE INVENTION

The present invention relates generally to a data processing apparatus and, more specifically, to determining the power status of a memory circuit.

The reduction of power consumption is an important aspect of current integrated circuit design in view of the prevalence of battery powered, portable electronic devices. Many such portable devices include a system on chip (SoC). An SoC typically includes a processor and one or more memories, and the memories account for a significant portion of the power consumption of the SoC.

It is known to manage power consumption by varying power supplied to circuit components, such as memory, according to a current processing workload. For example, memory can be placed in a low power sleep mode during an inactive processing period, and placed in a high power operational mode during an active processing period. In the different power modes, at least one of the supply voltage and clock frequency can be dynamically varied so that the system is capable of delivering high throughput when required, yet battery life is extended via use of the low speed/power periods.

In such power management strategies, when the memory is asleep or in low power mode, the memory array cannot be accessed until the memory is fully awake. Thus, the time required for the memory to transition from the sleep mode to a fully operational mode is important. In conventional systems, a power management controller holds access to memory during a predetermined wake-up time. The wake-up time is determined in advance via simulation and then a value is assigned for the hold time.

One problem that can arise when using a fixed delay for the wake-up time is that the fixed delay value is inherently inaccurate because actual circuit operation varies depending on process, voltage and temperature (PVT). As a consequence, if the estimated delay time is less than the actual delay time, the power management controller will permit memory accesses to be performed before the memory is actually operational, which can cause the system to fail. Accordingly, it would be advantageous to have a better way to determine actual memory wake-up time.

BRIEF DESCRIPTION OF THE DRAWINGS

The invention, can be understood by reference to the following description of example embodiments together with the accompanying drawings in which.

DETAILED DESCRIPTION OF PREFERRED EMBODIMENTS

Figure 1:
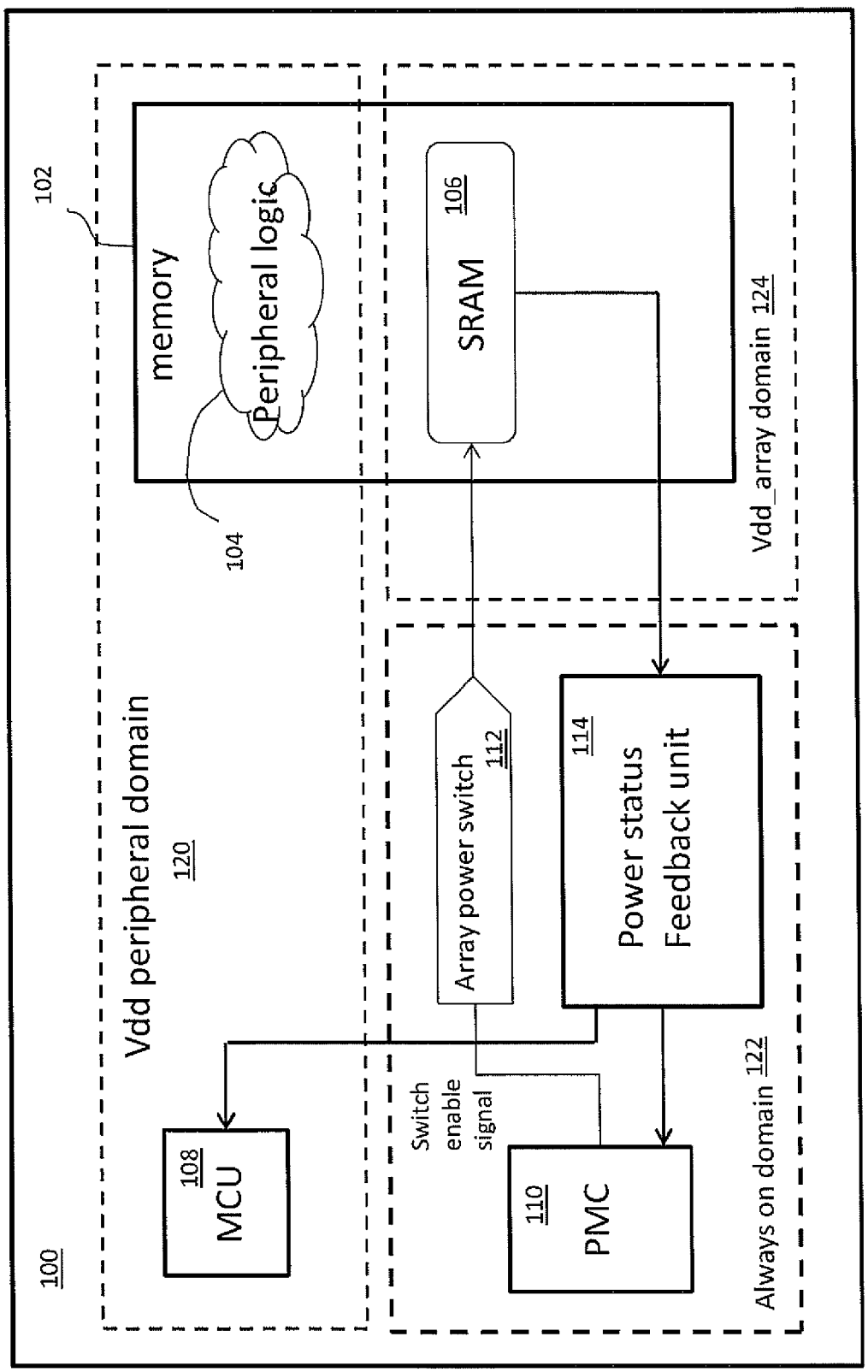
FIG. 1 is a schematic block diagram of a system on chip including a power status feedback unit in accordance with an embodiment of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides an integrated circuit including a memory circuit with a memory array, and a power control circuit for controlling power supplied to the memory array and for controlling access to the memory array. The power control circuit supplies the memory array with a supply voltage corresponding to one of a plurality of memory performance levels including a full performance level and at least one power-saving performance level. A voltage sensing circuit is coupled to the memory array for sensing a voltage level of the memory array. The voltage sensing circuit generates a power status signal that indicates a memory performance level of the memory array depending upon the sensed voltage level. The power control circuit also permits access to the memory array depending upon the power status signal.

In another embodiment, the present invention provides a method of controlling access to a memory in an integrated circuit, the integrated circuit including a memory, a processor, and a power management controller having a voltage sensing circuit. The method includes supplying the memory with a supply voltage corresponding to one of a plurality of memory performance levels including a full performance level and at least one power-saving performance level, and sensing a voltage level of a memory array of the memory with the voltage sensing circuit. A power status signal for the memory array is generated that indicates one of the plurality of memory performance levels of the memory depending upon the sensed voltage level. A memory access operation is permitted depending upon the value of the power status signal.

In a further embodiment, the present invention provides a controller for controlling access to a memory array of a memory circuit. The controller includes a voltage sensing circuit for receiving a sensed voltage level of the memory array, and a power management controller (PMC) connected to the voltage sensing circuit. The PMC generates a power status signal indicating one of a plurality of memory performance levels of the memory circuit including a full performance level and at least one power-saving performance level, depending upon the sensed voltage level, and permits a memory access operation depending upon the value of the power status signal.

Referring now to FIG. 1, a schematic block diagram of an integrated circuit (IC) 100, which may be a System on a Chip (SOC), highlighting the features of the present invention is shown. The IC 100 includes memory circuit 102 having peripheral logic 104 and a memory array 106. In one embodiment, the memory array 106 comprises a SRAM array. The IC 100 also includes a memory control unit (MCU) 108; a power management controller (PMC) 110; an array power switch 112, and a power status feedback unit 114. The IC 100 has a plurality of voltage domains that are provided to conserve power, including a first or Vdd peripheral domain 120, a second or always on domain 122, and a third or Vdd array domain 124, where Vdd denotes the positive supply voltage of the IC 100.

The memory circuit 102 spans two different voltage domains, namely, the Vdd peripheral domain 120 and the Vdd array domain 124. The memory peripheral logic 104 and the MCU 108 reside in the Vdd peripheral domain 120; the PMC 110, array power switch 112 and the power status feedback unit 114 reside in the always on domain 122; and the memory array 106 resides in the Vdd array domain 124. The memory circuit 102 comprises a plurality of memory blocks and/or the memory array 106, while the peripheral logic 104 comprises circuitry for controlling aspects of operation of the memory array 106. The positive supply voltage Vdd can be varied according to a power management strategy, such that Vdd is decreased by the PMC 110 to place the memory circuit 102 into a sleep state and increased to place the memory circuit 102 in an operational state. There is a maximum supply voltage corresponding to a full operational state of the IC 100.

Preferably, the memory circuit 102 is configurable to operate at a plurality of different performance levels with corresponding supply voltages. The plurality of performance levels at least include a full performance level, where the supply voltage is a full (maximum available) supply voltage and at least-one power saving performance level in which the voltage supplied to the memory 102 is less than the full supply voltage. The plurality of performance levels can be categorized as operational performance levels (or states) where memory access operations can be performed. For example the full performance level is an operational performance level corresponding to a full voltage level and a full clock frequency, but at least one further operational performance level can be provided in which memory access operations can still be performed, but at reduced voltage and reduced clock speed relative to the full performance level.

A power saving performance level can be either a data-retaining performance level where the supply voltage is sufficient to retain data stored in the memory circuit 102 (in the sense that volatile memory retains data), or alternatively the performance level can be a data-loss power-saving performance level where the supply voltage is insufficient to retain data stored in the memory circuit 102. Any power-saving performance level where the voltage and clock speed are inadequate to reliably support memory access operations are referred to herein as sleep-states. When the memory circuit 102 is in a sleep state, memory access operations cannot be performed. As is known in the art, a sleep state is a state where processing operations are temporarily suspended.

The PMC 110 implements a power control strategy depending upon prevailing processing requirements. Reducing the supply voltage Vdd decreases energy consumption because energy consumption is generally a quadratic function of voltage. One power saving technique is to reduce the clock frequency during periods when computational activity is low. This reduces power but does not significantly affect the total energy consumed per processing task because the total energy is largely independent of clock frequency. Reducing the voltage tends to improve energy efficiency, but peak throughput is compromised. Dynamically varying both clock frequency and supply voltage Vdd in response to computational load demands allows the energy consumed per task to be reduced during periods of low processing throughput yet allows peak throughput to be available when required. The PMC 110 is configurable to implement these power saving strategies.

The voltage Vdd array provided to the Vdd array domain 124 is independent from the voltages corresponding to the always-on domain 122 and the Vdd peripheral domain 120. As shown in FIG. 1, Vdd array is derived from the array power switch 112, which is controlled by the PMC 110. The PMC 110 generates a switch enable signal that is provided to the array power switch 112 and when the array power switch 112 is on, the switch 112 supplies the memory array 106 with a Vdd array net signal. The placement of the array power switch 112 in the always on domain 122 allows the array power switch 112 to retain its functionality even in low power modes/states of the IC 100 and thus the memory array 106 can be separately switched according to a dynamic power management control algorithm. Thus, for example, the memory array 106 can be switched to a low power mode/power-saving state independently from a processor circuit (not shown) of the IC 100.

The power status feedback unit 114 performs a measurement of the current power status of the memory array 106 and generates one or more signals providing an indication in real-time of the memory array 106 power status, and to process the power status information for use by advanced program applications such as power management software. Thus, the power status feedback unit 114 provides visible and verifiable information on memory power status.

The power status feedback unit 114 obtains the memory array power status measurement by reading a voltage signal from a sense net comprising pins of the memory array 106. The sensed voltage level of the memory array 106 is supplied to the MCU 108 and to the PMC 110. In one embodiment, the MCU 108 comprises microcontroller circuitry. In alternative embodiments the MCU 108 is, for example, one of: a processing core, a System on Chip, platform logic and a Memory Management Unit.

Figure 2:
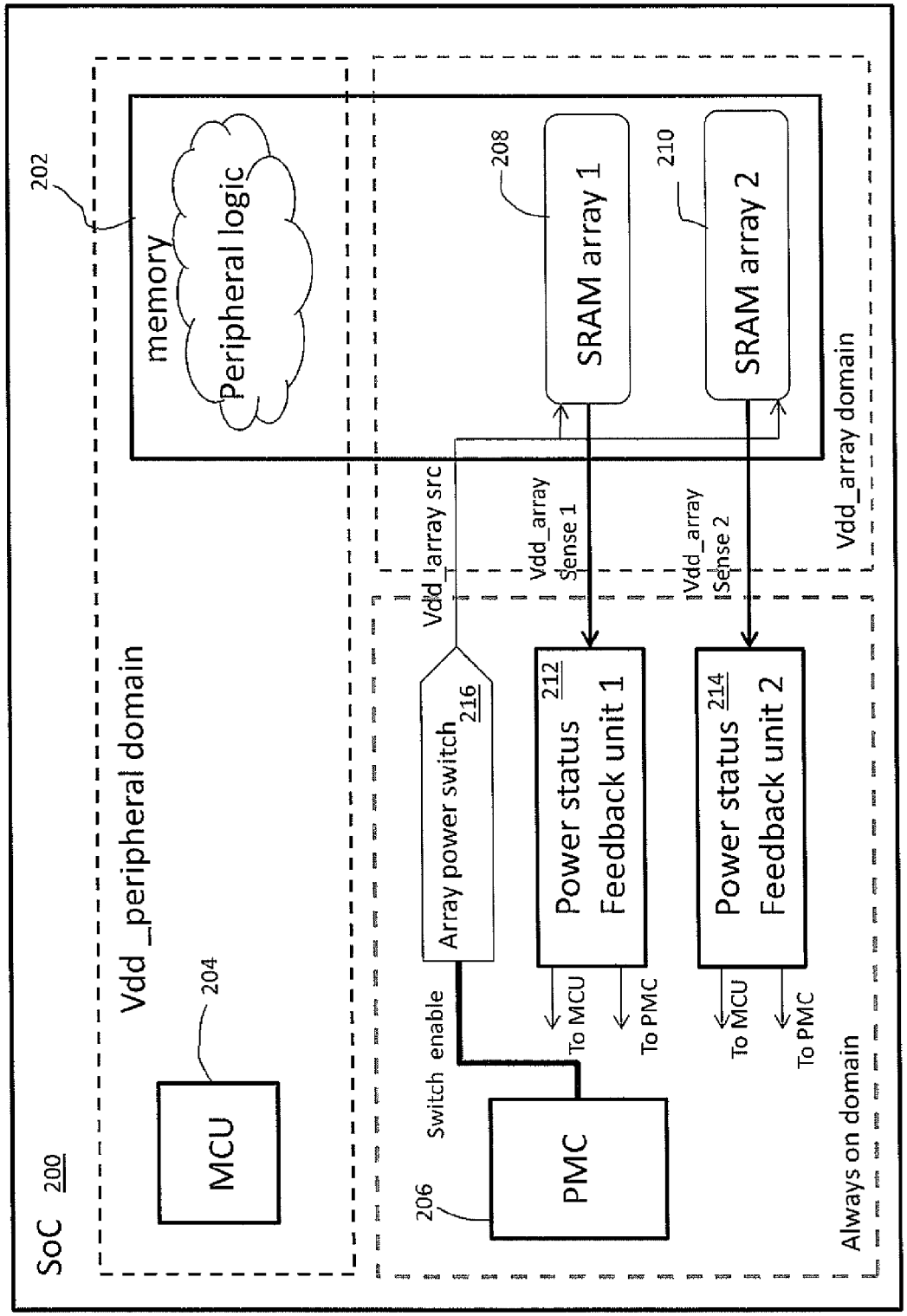
FIG. 2 is a schematic block diagram of a system on chip including a plurality of power feedback units in accordance with another embodiment of the present invention.

FIG. 2 schematically illustrates an integrated circuit 200 according to a second embodiment of the present invention. The IC 200 is similar to the IC 100 of FIG. 1 in that it comprises a memory circuit 202, a memory controller unit 204 and a power management controller 206, but differs in that it comprises a plurality of SRAM arrays 208, 210 rather than a single SRAM array. In this example embodiment, two SRAM arrays have been shown, but in alternative embodiments any number of SRAM arrays can be provided, as will be understood by those of skill in the art. As shown in FIG. 2, the first SRAM array 208 is connected to a corresponding first power status feedback unit 212, which performs an on-chip measurement of voltage sensed within the first SRAM array 208, processes the signal and supplies the voltage measurement to the PMC 206 and the MCU 204. Similarly, the second SRAM array 210 is connected to a second power status feedback unit 214, which senses the prevailing voltage directly from circuit pin(s) of the second SRAM array 210 and processes that signal for supply to the PMC 206 and the MCU 204.

The IC 200 also has an array power switch 216 for switching Vdd to both the first and second SRAM arrays 208 and 210. However, the arrangement is configured such that power to the two SRAM arrays 208, 210 can be independently switched depending upon processing requirements. In alternative embodiments, separate array power switches could be provided to each memory array, memory block or portion.

Figure 3:
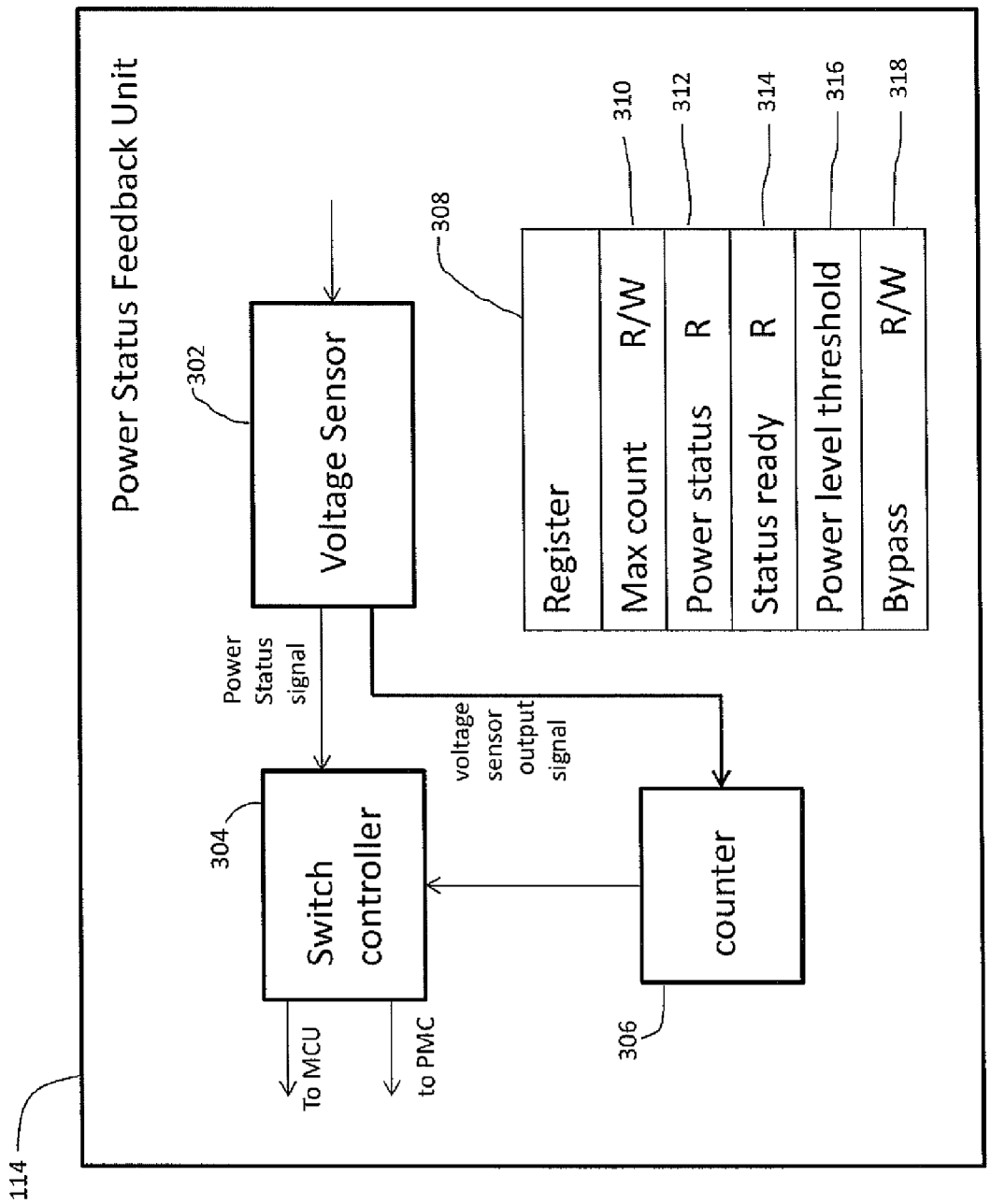
FIG. 3 is a schematic block diagram of the power status feedback unit of FIG. 1.

FIG. 3 is a schematic block diagram of the power status feedback unit 114 of FIG. 1. The power status feedback unit 114 includes a voltage sensor 302, a switch controller 304, a counter 306 and a set of power status registers 308. The voltage sensor 302 comprises circuitry for sensing a voltage level of the memory array 106 via circuit pins (a power net), circuitry for processing the sensed signal and outputting a power status signal to the switch controller 304 indicating one of power off and power on. In this embodiment, the power status signal is a digital signal and an edge of the digital signal indicates that a switch event is complete. The voltage sensor 302 determines a power status for the memory array 106 or at least a part thereof in real-time.

In this embodiment, the power status signal output by the voltage sensor 302 and supplied to the switch controller 304 is asynchronous to the switch controller 304. In other words, there is not a common clock controlling output of the switch controller 304 and output of the voltage sensor 302. However, in alternative embodiments the power status signal output by the voltage sensor 302 is synchronous with the switch controller 304.

A further voltage sensor output signal is supplied as an input to the counter 306. The voltage sensor output signal is used for voltage disturbance detection. In particular, the voltage sensor 302 detects voltage disturbances including a voltage dip of more than a predetermined minimum duration. Such voltage dips potentially give rise to data loss and/or data corruption in the portion of the memory array 106 affected by the voltage dip. The counter 306, upon detection of an initial dip in voltage, performs a count to establish whether the duration of the dip is greater than or equal to a threshold duration likely to result in data loss from memory. If the voltage dip is found to last at least the threshold duration then the switch controller 304 receives this information from the counter 306 and supplies it to the MCU 108 and/or the PMC 110, which trigger a lost data recovery process. The lost data recovery process is described in more detail in FIG. 9.

The voltage sensor 302 belongs to the always-on voltage domain 122 of FIG. 1 in this embodiment and physically abuts the memory array 106. However, in alternative embodiments the voltage sensor 302 is physically placed such that it is bundled within a block of the memory array 106, although overall the voltage sensor 302 still operates in the always-on voltage domain 122.

Precise physical placement of the Vdd array power sense net (voltage measurement pin) is performed for a particular SoC configuration by taking into account worst case delivery from the Vdd array source net (pins) corresponding to the signal path from the array power switch 112 to the memory array 106 (see FIG. 1) and for the signal path from the memory array 106 to the power status feedback unit 114. This worst case delivery scenario takes into account current (I) times resistance (R) (I*R) drops between the two nets.

The switch controller 304 performs control functions depending upon sensed voltage results from the voltage sensor 302. The switch controller 304 processes the power status signal from the voltage sensor 302 and generates the signals supplied to the memory controller unit 108 and the power management controller 110, which signals are used by both hardware and software of which the integrated circuit 100 forms a part. In FIG. 3, the switch controller 304 receives the power status signal from a single voltage sensor 302, but in alternative embodiments, a single switch controller is configured to receive asynchronous digital voltage signals from a plurality of voltage sensors corresponding to a plurality of different segments of the memory array 106. The switch controller 304 sends the final power status information to the PMC 110 both synchronously and asynchronously for different usages.

As shown in FIG. 1, the power status feedback unit 114 is located in the always on voltage domain 122. Placement of both the voltage sensor 302 and the switch controller 304 in the always on voltage domain 122 means that they are both fully operational even in a low power processing mode (power-saving state) of the IC 100.

The set of registers 340 is accessible to the memory controller unit 108 and depending upon a value read from the registers 340, the memory controller unit 108 determines whether or not it is permitted to switch the memory array 106 between a power saving state (e.g., a sleep mode) and an operational state corresponding to a higher supply voltage (e.g., full power state). In some embodiments there may be only two distinct states of awake and asleep, but in this particular embodiment there is a plurality of operational states having a respective plurality of different operational voltage levels provided. The memory array 106 can be switched between any one of the plurality of states and any other of the plurality of states depending upon a power management strategy.

The counter 306 is a core component of a sleep time control function according to an embodiment of the present invention. According to the sleep time control function, the memory array 106 can only transition from the sleep state to the operational state (i.e., can only wake up after it has remained in a sleep state for a predetermined sleep time). The purpose of this functionality is to avoid too frequent transitions of the memory 110 between a sleep mode and an operational mode. In this embodiment, the counter 306 is reset to zero and starts to count when the memory array 106 receives a power event indicating that a sleep/wake-up state transition is to take place and stops counting when it reaches a maximum value, the maximum value having been defined in advance. As described above, the counter 306 also maintains a count associated with the duration of a detected voltage dip and associated with a lost-data recovery process.

As will be described below with reference to FIG. 4, the counter 306 is controlled to count according to one of the bus/system clock and a low power clock. The low power clock has a lower frequency than the system/bus clock, but is always on regardless of the currently implemented power state/power mode of the IC 100.

The set of registers 340 includes a maximum count value 310; a power status value 312; a status ready value 314; a power level threshold value 316; and a bypass value 318. The maximum count value 310 is a read/write register holding a maximum count value for the counter 306. The maximum count value controls the frequency of transitions of the memory array 106 between the sleep state and the operational state. The maximum count value is programmable. The power status value 312 is a read-only register that specifies an on/off power status for the corresponding memory array 106. In the embodiment of FIG. 2, if there is a plurality of SRAM arrays 208, 210, then a corresponding plurality of power status values is stored in the power status register 312.

The status ready register 314 stores a read only value that specifies whether sufficient time has elapsed such that the memory array 106 can be transitioned out of a sleep state to an operational state. A status ready status bit is set when the counter 306 reaches a predetermined threshold value indicating that a minimum sleep time period has elapsed and the status bit is reset when the counter 306 is reset. In this embodiment, the counter 306 counts from zero up to a predetermined maximum count threshold, but in alternative embodiments, the counter 306 could decrement starting from a maximum value to determine when the minimum sleep time has been reached.

The bypass register 318 is a read/write register configurable to specify whether or not the counter 306 function is to be bypassed. That is, the bypass register 348 allows the sleep time control function to be turned on or off, whereas the maximum count register 310 allows the sleep time threshold to be parameterized. Although the sleep time control function only allows the memory array 106 to wake up after it been in a sleep/power-saving mode for a predetermined sleep time, this requirement can be overridden by a high priority access request via use of the bypass register 318. The high priority access request could come from, for example, an execution unit of the IC 100, a microcontroller instruction or a user application program.

Figure 9:
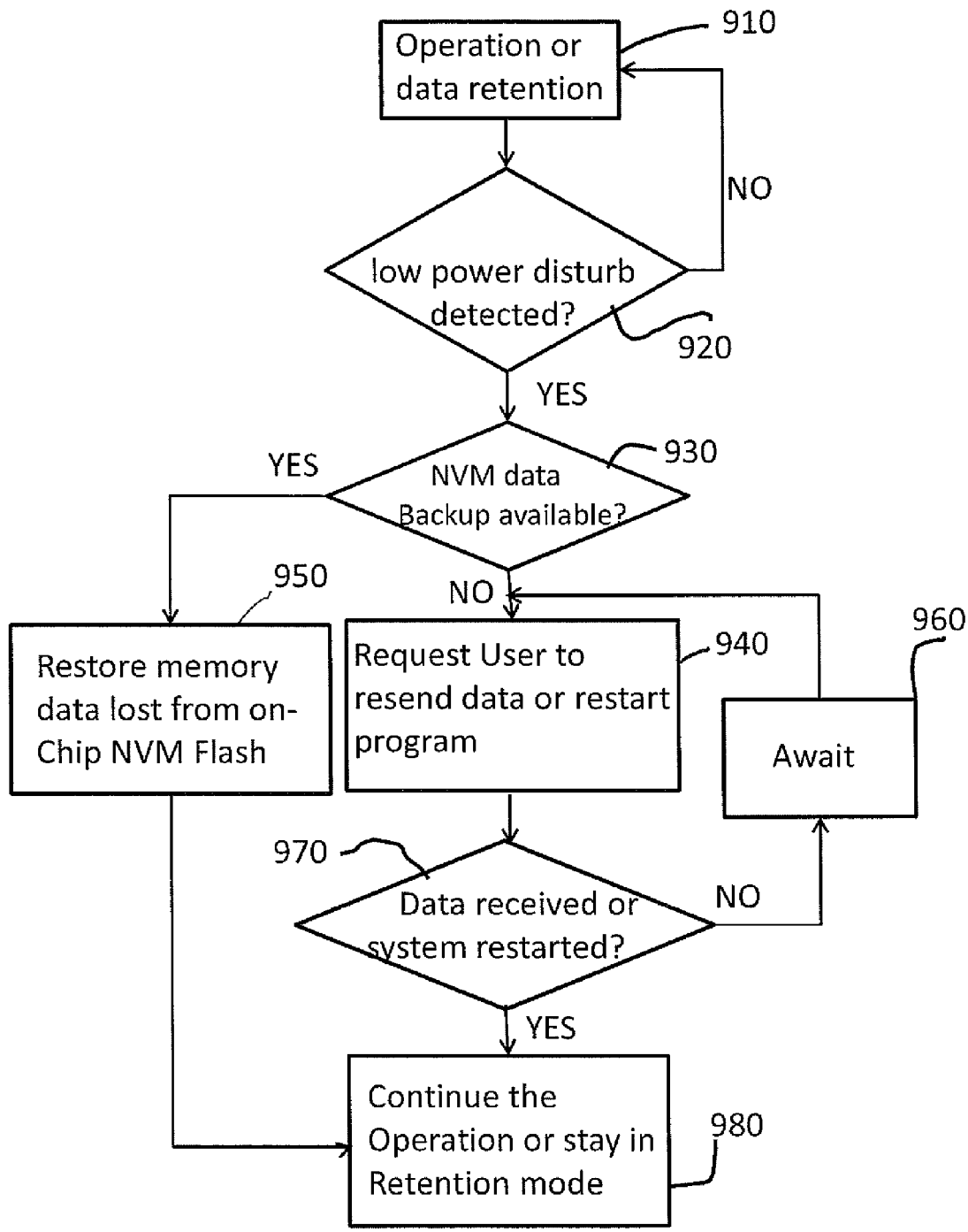
FIG. 9 is a flow chart illustrating a process for detecting a voltage disturbance with the potential to induce data loss/corruption within a memory and for triggering recovery of any data lost in accordance with an embodiment of the present invention.

The power level threshold register 316 is a read/write register configurable to store a user-configurable power threshold value associated with the lost data recovery process of FIG. 9. A value stored in the power level threshold register 316 defines the voltage below which the memory voltage sensed by the voltage sensor 302 has to drop to categorize a drop in voltage as a voltage disturbance of sufficient magnitude to at least potentially cause loss of data stored in the memory array 106. For example, in this embodiment the power level threshold associated with the voltage dip is less than 70% of the maximum full supply voltage.

Figure 4:
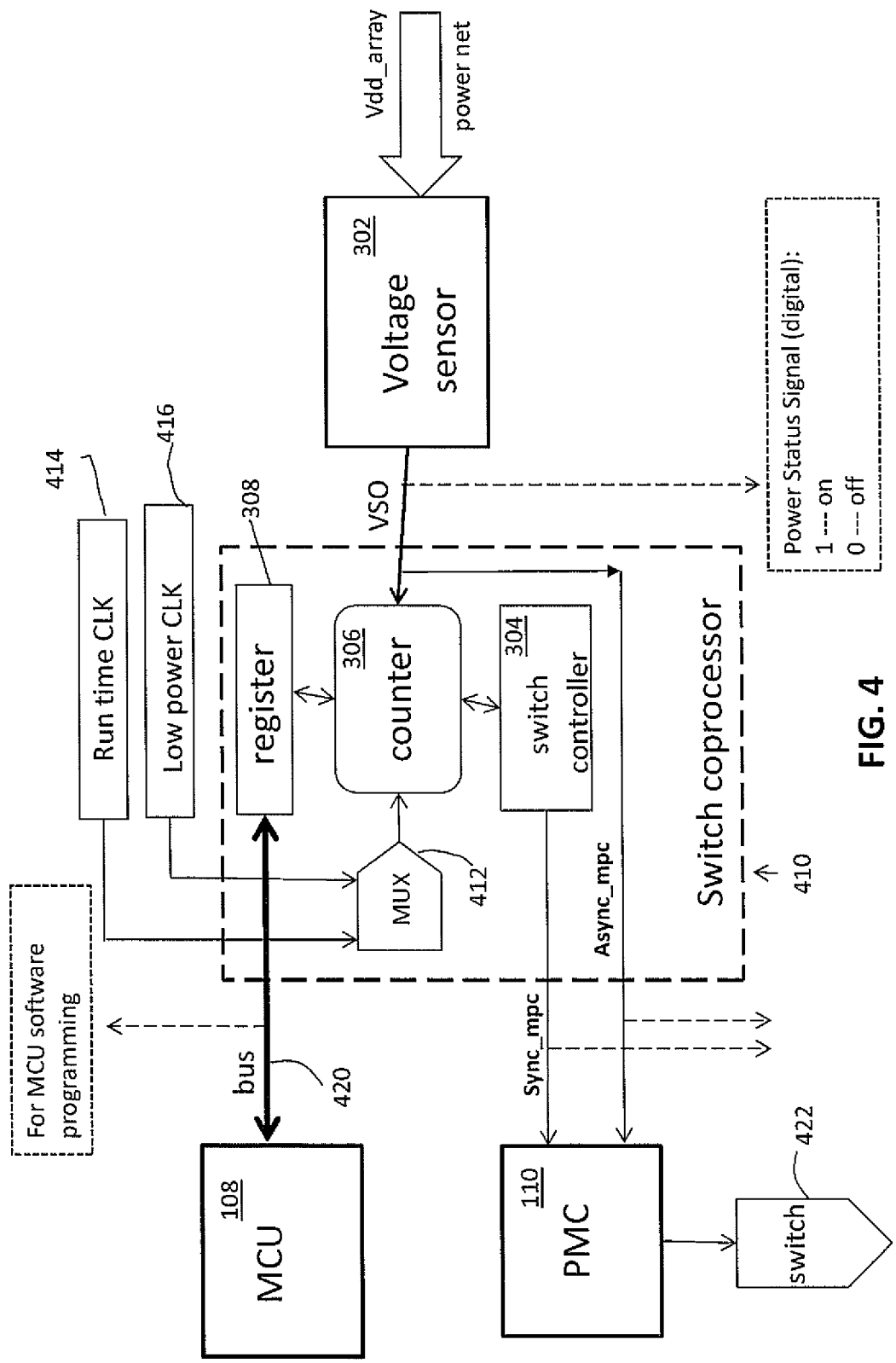
FIG. 4 is a schematic block diagram illustrating a switch controller of FIG. 3.

FIG. 4 schematically illustrates how the switch controller 304 (FIG. 3) processes power status signals from the voltage sensor 302 for use by the MCU 108 and the PMC 110. As shown in FIG. 4, the components of the power status feedback unit 114 comprising the switch controller 304, the counter 306 and the registers 308 have been grouped together as circuitry performing the function of a switch coprocessor 410.

The switch coprocessor 410 further comprises a multiplexer 412 for selecting between a runtime clock 414 and a low power clock 416 for clocking the sleep time counter 306. The low power clock 416 runs at a clock frequency that is low relative to the runtime clock 414 and is always on. The runtime clock 414 may be temporarily gated in a sleep mode of the memory array 106.

A bus 420 is provided to form a communication link between the MCU 108 and the registers 308. The MCU 108 reads the registers 340 to determine whether or not a transition between a sleep mode and an operational mode of the memory array 106 should be permitted. Information on the bus 420 is also accessible to software programs of the MCU 108.

As shown in FIG. 4, the digital power status signal 313 output by the voltage sensor 302 is supplied to the switch coprocessor 410. The power status signal 313 is fed directly via the switch coprocessor 410 to the PMC 110 as an asynchronous memory power control signal (async_mpc). The power status signal is also fed to the counter 306, which performs processing together with the registers 308 and the switch controller 304, resulting in the switch controller 304 supplying a synchronous memory power control signal (sync_mpc) to the PMC 110. The PMC 110 uses a switch 422 to control access to the memory array 106 for read/write operations depending upon at least one of the asynchronous memory power control signal (async_mpc) and the synchronous memory power control signal (sync_mpc).

Figure 5:
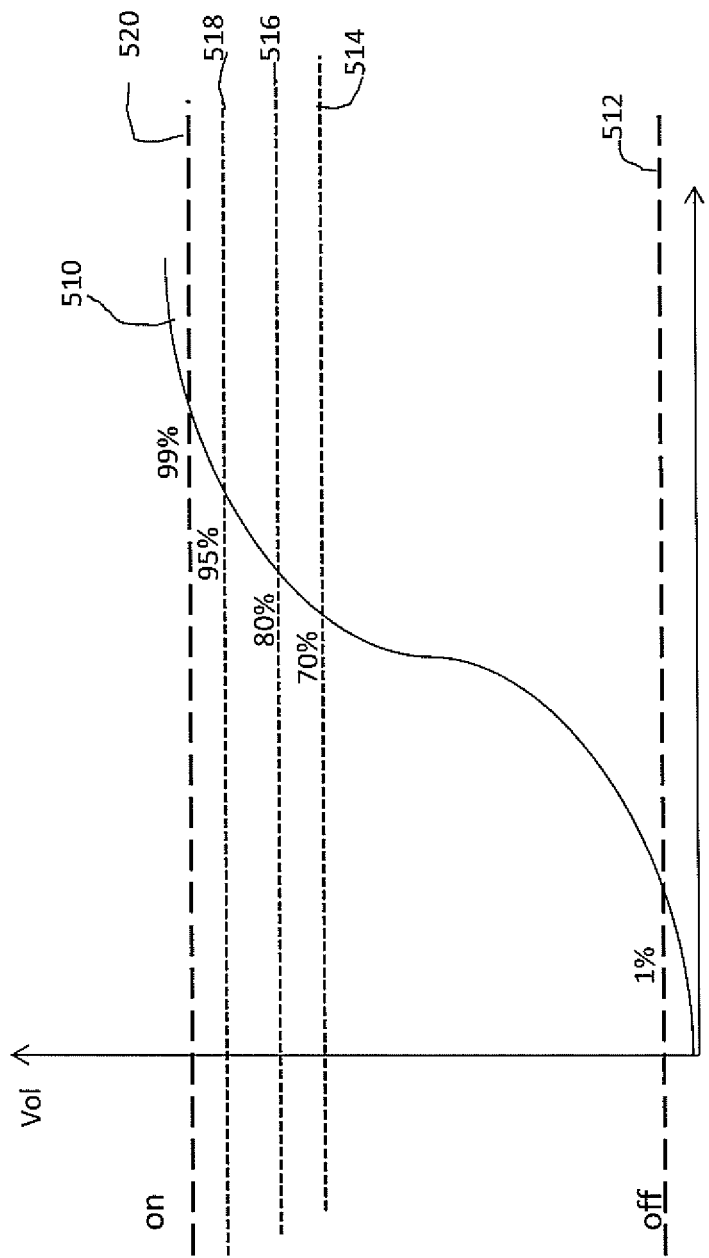
FIG. 5 is a graph schematically illustrating voltage cut-off thresholds for a memory circuit based on a transition between a power-saving state and an operational state in accordance with an embodiment of the present invention.

FIG. 5 is a graph illustrating a voltage profile for the memory array 106 of FIG. 1 as sensed by the voltage sensor 302 as the memory array 106 transitions between an off state and an on state. A voltage profile line 510 shows a sensed voltage profile as the memory array 106 transitions between a sleep state or off state where Vdd is reduced to zero and an operational or on state where Vdd is increased to a full supply voltage value (maximum value), where data processing is sustainable. Depending upon thresholds set according to the voltage profile of FIG. 5, the power status signal from the voltage sensor 302 toggles between different ones of the plurality of memory performance levels. Where there are only two performance levels, for example, a sleep state and an awake state, the power status signal simply toggles between the off and on states.

However, as shown in FIG. 5, a number of different voltage thresholds may be set. A first voltage threshold 512 corresponding to 1% of the full source voltage indicates whether the memory circuitry is on or off. The memory array 106 is in the off state at below 1% of the full source voltage. A second voltage threshold 514 corresponds to 70% of the full source voltage; a third voltage threshold 516 corresponds to 80% of the full source voltage and a fourth voltage threshold 518 corresponds to 95% of the full source voltage. In alternative embodiments, the percentage values of the thresholds are set differently according to performance requirements and/or circuit characteristics.

In one embodiment the memory array 106 has a first power on state with a first voltage level for a memory access operation to the memory array 106 at a first clock frequency. In this particular example the first voltage level is greater than or equal to 95% of the full operational voltage (i.e., greater than the fourth threshold 518). There is a second power on state with a second voltage level for a memory access operation to the memory array 106 at a second clock frequency, the second voltage level being lower than the first voltage level with a first predetermined voltage margin and the second clock frequency being lower than the first clock frequency. In this particular embodiment, the second voltage level is defined to fall within a range of greater than or equal to 80% but less than 95% of the full operational voltage (i.e., between the third and fourth voltage thresholds 516, 518).

In addition to the two different power-on states, there are also two power-saving states. In a first power saving state there is a third voltage level for a first non-access operation mode to the memory array 106 where the data stored in the memory array 106 is retained. The third voltage level is equal or lower than the second voltage level and falls within second predetermined voltage margin. In this particular embodiment, the second predetermined voltage level is greater than or equal to 70% but less than 80% of the full operational voltage (i.e., between the second and third voltage thresholds 514, 516). The second power saving state corresponds with a fourth voltage level for a second non-access operation mode to the memory array 106 where the data stored in the memory array 106 is not retained. The fourth voltage level is lower than the third voltage level, and in this particular embodiment is less than 70% of the full operational voltage (i.e., lower than the second voltage threshold 514).

In an embodiment with a single power on state and a single power off state, the PMC 110 will hold an "access granted" memory control signal low until the signal from the array power switch 112, Vdd_array net, is greater than or equal to 95% of the full Vdd voltage value corresponding to the fourth voltage threshold 518. The Vdd_array net, selected as one of the weakest Vdd_array nets in power distribution in Vdd_array domain 124, is connected to the voltage sensor 302, which is coupled to the power status feedback unit 114. Thus, when a state transition from a sleep mode to an operational mode is performed, the power status signal continues to indicate power off until Vdd_array net is greater than or equal to 95% of Vdd. On the other hand, in this same two-state embodiment, when a state transition from an operational mode to a sleep mode is performed, the power status signal generated by the voltage sensor 302 continues to indicate power on until Vdd_array net is less than or equal to 5% of Vdd, whereupon the memory array 106 is considered to have entered a full sleep/stop mode.

Figure 6:
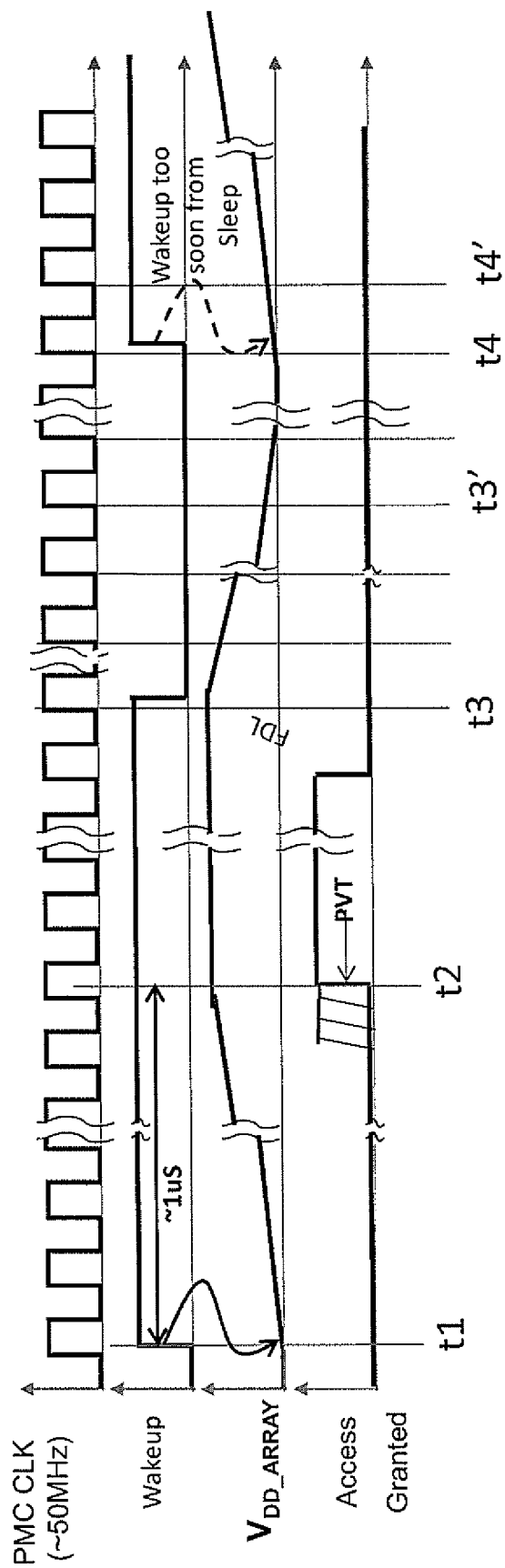
FIG. 6 is a timing diagram illustrating the relative timing of permitting memory access following a memory wake-up event in a conventional system.

FIG. 6 is a signal diagram illustrating the timing for certain signals for a wake-up/sleep control sequence in a conventional SoC that has a fixed delay line between initiating wake-up and permitting memory access. As shown in FIG. 6, at time t1 a wake-up signal transitions from low to high indicating that the memory array is being woken up from sleep state to operational state. The time interval (t2−1) corresponds to a fixed delay line determined from advance simulation to be 1 microsecond. Accordingly, at time t2 memory access is granted. There is also a fixed delay line between the signal edge where the "access granted" signal transitions from high to low and when the wake-up signal transitions from high to low shortly after t3.

A subsequent transition from a sleep state to an operational state is instigated by the rising edge of the wake-up signal soon after time t4. However, it can be seen from the Vdd array voltage profile illustrated in FIG. 6 that there has been insufficient time between the sleep transition of the wake-up signal at t3 and the wake-up transition at t4. Frequent transitions between the sleep and wakeup states can consume a lot of power and so, to achieve energy efficient operation, should be avoided. For a SRAM array, a minimum sleep time can be determined to achieve good overall energy savings by considering both standby energy savings (i.e., sleep mode energy savings) and the dynamic switching energy required to enter and exit the sleep state.

Figure 7:
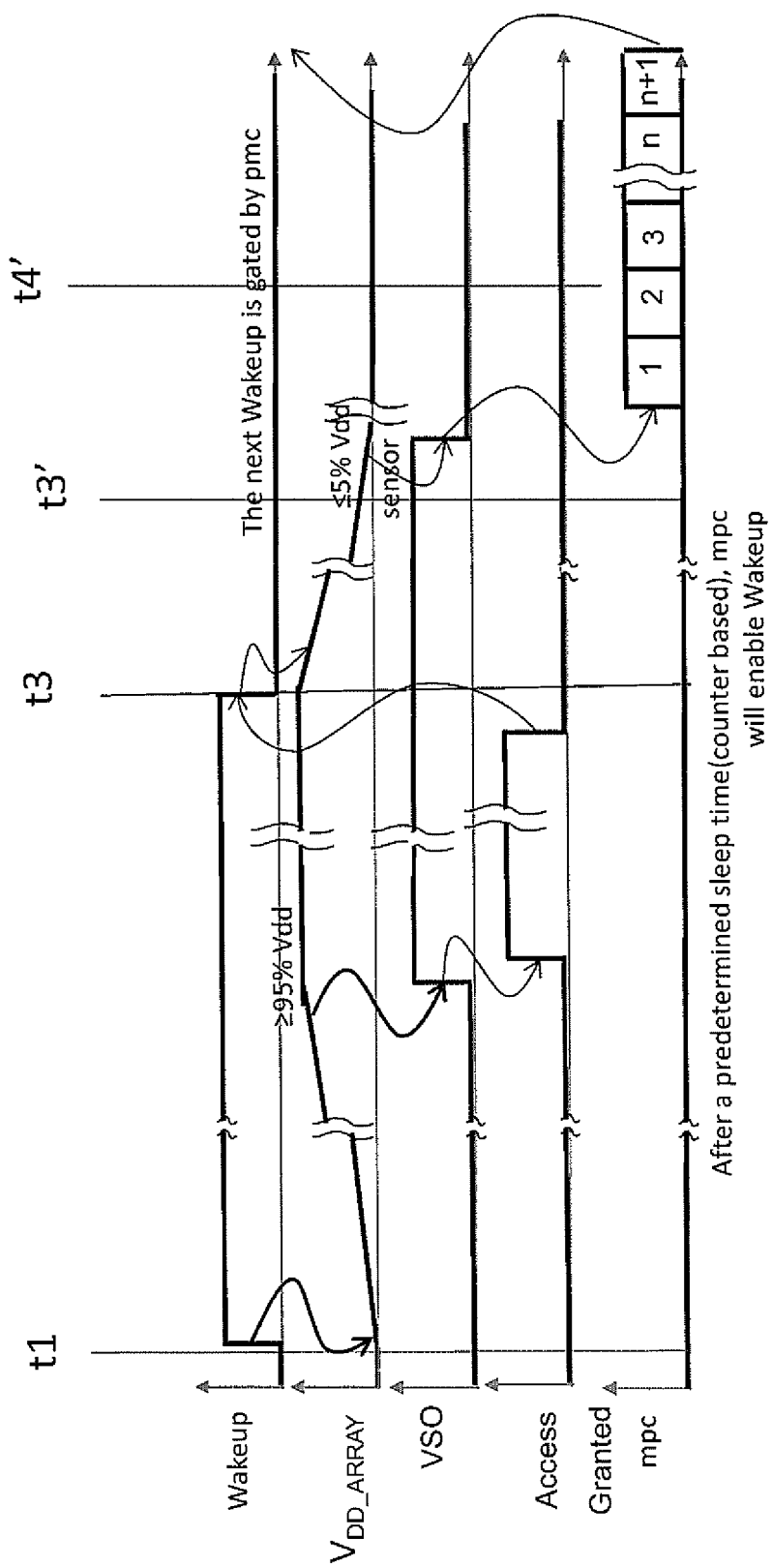
FIG. 7 is a timing diagram illustrating the relative timing of permitting memory access following a memory wake-up event according to an embodiment of the present invention.

FIG. 7 is a signal timing diagram illustrating a wake-up/control sequence according to an embodiment of the present invention, which may be compared and contrasted with the signal timing diagram of FIG. 6. FIG. 7 shows that a new signal "VSO" corresponding to the power status signal generated by the voltage sensor 302 is used to perform control of memory access in the event of a transition from a sleep mode to an operational mode of the memory array 106. At time t1 a wake-up signal transitions from low to high. In this case, memory access is granted depending upon when the power status signal VSO transitions from low to high, which indicates that Vdd array has reached greater than or equal to 95% of the full (maximum) Vdd. This is to be contrasted with FIG. 6 where a predetermined fixed delay was implemented. The power status signal VSO remains high even after the wake-up signal has transitioned to low at time t3.

In fact VSO 313 only transitions from high to low between times t3' and t4', after it has been established from the measurement performed by the voltage sensor 302 that VDD_array has fallen to less than or equal to 5% Vdd. The high to low transition of the power status signal VSO triggers the counter 306 to start counting up to a predetermined sleep time depending upon a value stored in the maximum count register 310 (FIG. 3). In the time interval when the power status signal VSO is still high, but after the falling edge of the wake-up signal, it would be undesirable to permit access to the memory array 106. The PMC 110 chooses the asynchronous power management control signal or the synchronous power management control signal (as required) to determine whether or not the memory array 106 is accessible. Thus, according to the present invention, a subsequent wake-up of the memory array 106 is gated by the PMC 110 depending upon the maximum count. The count is triggered by the falling edge of the sensed power status signal, which is not available in the conventional system. This sleep time control facility, which depends upon the power status signal from the voltage sensor 302 reduces the likelihood of the memory array 106 toggling too frequently between the sleep mode and the operational mode. However, as mentioned previously and described below, if required, it can be overridden by a high priority memory access request.

Figure 8:
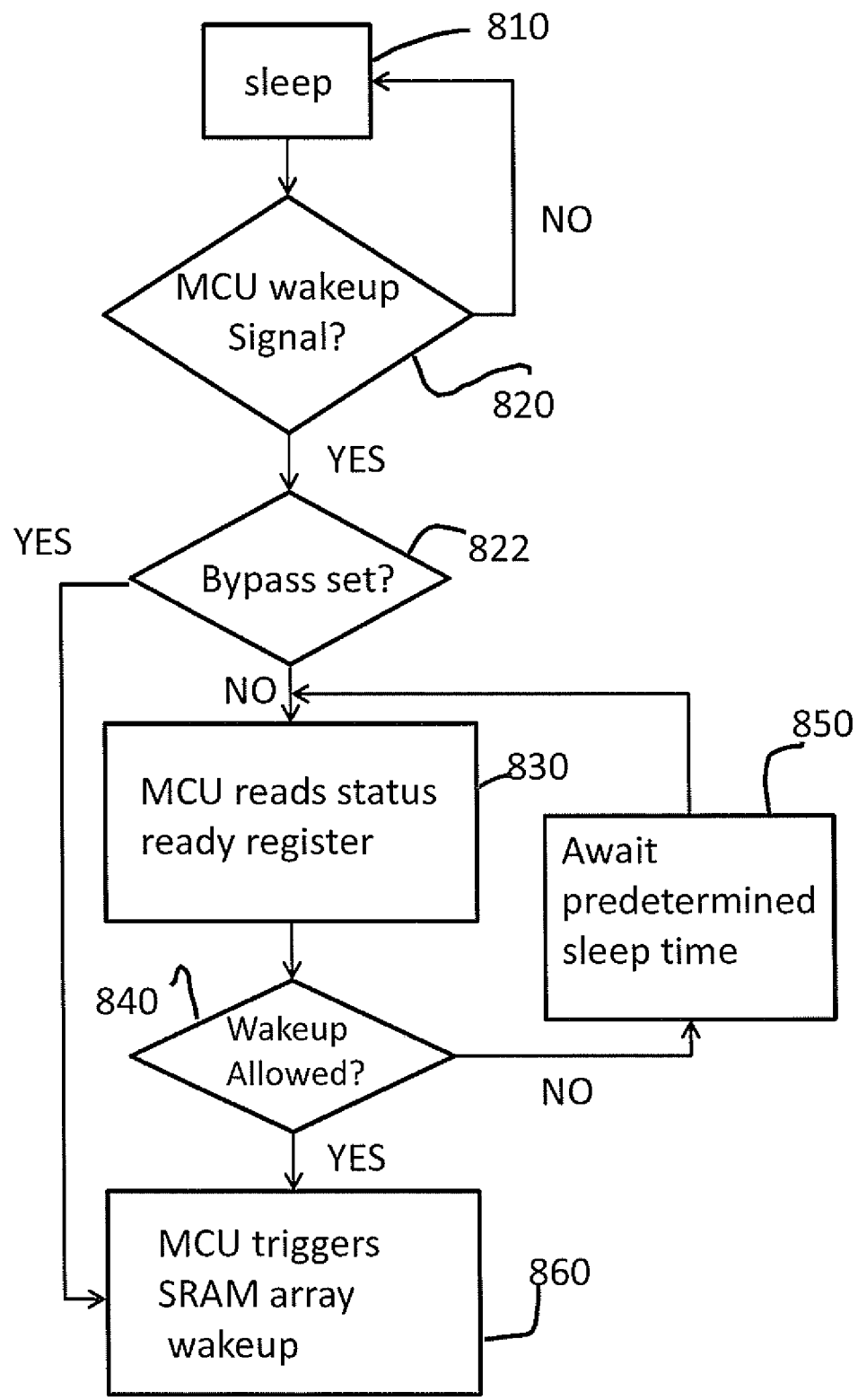
FIG. 8 is a flow chart illustrating an SRAM array wake-up process in accordance with an embodiment of the present invention.

FIG. 8 is a flow chart illustrating a sleep control process according to an embodiment of the present invention. At step 810 the memory array 106 is in a sleep state. A check is performed at step 820 to determine if a wake-up signal has transitioned from low to high indicating that the memory controller unit 108 is requesting a transition from sleep mode to operational mode. If no wake-up transition signal is detected at step 820, the process returns to step 810. However, if a wake-up signal is detected at step 820, the process proceeds to step 822, where it is determined whether or not a bypass of the sleep control function has been set by reading a status bit in the bypass register 318 (FIG. 3).

If bypass has been set, for example, where a high priority data access is required, the process proceeds directly to step 860, where the memory controller unit 108 triggers a memory wake-up. However, if no bypass has been set, then the process proceeds to step 830, where the memory controller unit 108 reads the status ready register 314. The status ready register 314 indicates that a status transition is permitted in the event that the counter 306 has completed a count establishing that the predetermined maximum count stored in the max count register 310 has been reached and thus the memory array 106 has been in the sleep time for at least a predetermined minimum sleep time. After reading the status ready register 314 the process progresses to step 840 of determining whether or not a wake-up is allowed.

If no wake-up is allowed the process proceeds to step 850, where time is allowed to elapse and the status register 314 is rechecked at step 830 until the status bit indicates that wake-up is allowed. If the status bit is found to indicate that wake-up is allowed at step 840, then the process proceeds to step 860, whereupon the memory controller unit 108 triggers wake-up of the memory array 106.

During the SRAM wake-up process of step 860, the OMC 110 suppresses access to the memory array 106 until the voltage sensor 302 indicates that Vdd_array has reached a predetermined threshold voltage level. The threshold voltage level should be sufficiently high to prevent a system crash. As noted above, if a bit in the bypass register 318 has been set, for example in the event of a high priority memory access request having been received, then the process will proceed through step 840 to step 860 regardless of the contents of the status ready register 314. Thus, the power status signal output by the voltage sensor 302 enables sleep control to be performed by triggering the counter 306.

FIG. 9 is a flow chart illustrating a lost-data recovery process performed in the event that a transient voltage-dip has potentially resulted in loss of data from the memory array 106. The process begins at step 910, where the memory circuit 102 (or the memory array 106) is in one of the plurality of memory performance levels capable of supporting data retention. This applies to the full performance levels and a subset of the power-saving performance levels, but excludes a performance level where the supply voltage is insufficient to retain data stored in the memory circuit 102.

While operating in one of these modes in which data is retained in the memory array 106 when the supply voltage is on, if a voltage drop (or glitch) occurs for at least a minimum duration, this can potentially result in loss of data stored in the portion of the memory circuit affected by the voltage drop. The voltage drop could be transient or even intermittent. For example, in the event of a high current being drawn from the memory power supply, the voltage applied to the memory circuit 102 (or memory array or memory block) can be temporarily reduced (transiently or intermittently).

This has the potential to cause data corruption in the memory array 106. Thus, at step 920, it is determined via a measurement made by the voltage sensor 302 (FIG. 3), whether or not a power disturbance effect involving a voltage dip has occurred. For a positive detection, the power disturbance event has at least a minimum duration monitored by the counter 306 (FIG. 3). If no power disturbance is detected at step 920, the process returns to step 910.

However, if a positive detection of a power disturbance is made at step 920, the process proceeds to step 930, where a check is made by the MCU 108 to establish if backup data is available for the affected memory portion by reading it from non-volatile memory. In this embodiment, the back-up data is stored in on-chip flash memory, but alternative forms of non-volatile storage could be used. If backup data is found to be available at step 930, the process proceeds to step 950, whereupon lost or corrupted data is restored from the on-chip flash memory.

After restoration of the data via the flash memory at step 950, the process proceeds to step 980, where the memory continues to operate in one of the plurality of memory performance levels. Alternatively, if no flash memory backup is available at step 930, the process proceeds to step 940 where the MCU 108 outputs an alert to either resend the lost data or to restart the program application that generated the data.

After step 940, the process proceeds to step 970 involving a check as to whether data recovery has been successfully performed via either restarting the system or receiving new data. If no data has been received at step 970, then the process proceeds to step 960 where there is a short delay prior to returning to step 940, where the MCU 108 makes a resend/restart request in an attempt to recover the missing data. Once the data is established at step 970 to have been successfully recovered by restart/resend, the process proceeds to step 980 where data processing continues in one of the plurality of memory performance levels.

It will be appreciated that embodiments of the present invention can be realized in the form of hardware, software or a combination of hardware and software. Any such software may be stored in the form of volatile or non-volatile storage, for example a storage device like a ROM, whether erasable or rewritable or not, or in the form of memory, for example RAM, memory chips, device or integrated circuits or on an optically or magnetically readable medium, for example a CD, DVD, magnetic disk or magnetic tape or the like. The computer program may be stored on a non-transient computer-readable medium. It will be appreciated that the storage devices and storage media are embodiments of machine-readable storage that are suitable for storing a program or programs comprising instructions that, when executed, implement embodiments of the present invention.

Throughout the description and claims of this specification, the words "comprise" and "contain" and variations of the words, for example "comprising" and "comprises", means "including but not limited to", and is not intended to (and does not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, characteristics described in conjunction with a particular aspect, embodiment or example of the invention are to be understood to be applicable to any other aspect, embodiment or example described herein unless incompatible therewith.

It will be also be appreciated that, throughout the description and claims of this specification, language in the general form of "X for Y" (where Y is some action, activity or step and X is some means for carrying out that action, activity or step) encompasses means X adapted or arranged specifically, but not exclusively, to do Y.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. An integrated circuit, comprising:
a memory circuit including a memory array;
a memory control unit that issues access requests to the memory circuit;
a power control circuit, coupled to the memory circuit, for controlling power supplied to the memory array and for controlling access to the memory array, wherein the power control circuit supplies the memory array with a supply voltage corresponding to one of a plurality of memory performance levels including a full performance level and at least one power-saving performance level; and
a power status feedback unit including a voltage sensing circuit coupled to the memory array for sensing a voltage level of the memory array, wherein the voltage sensing circuit generates a power status signal indicating one of the plurality of memory performance levels of the memory array depending upon the sensed voltage level, and wherein the power control circuit permits the access to the memory array depending upon the power status signal,
wherein the power status feedback unit further comprises a switch controller that processes the power status signal to generate a final power status signal for output to at least one of the power control circuit and the memory control unit; and wherein the voltage sensing circuit and the switch controller are located in an always-on voltage domain such that they are operable in any one of the plurality of power-saving performance levels.

2. The integrated circuit of claim 1, wherein the voltage sensing circuit detects a transient dip in voltage having longer than a threshold voltage-dip duration when the memory array is in any one of the plurality of memory performance levels for which the corresponding supply voltage is sufficient to support data retention, and wherein the memory control unit triggers a lost-data recovery process in response to detection of the transient voltage dip.

3. The integrated circuit of claim 2, wherein the power status feedback unit further comprises a counter coupled to the voltage sensing circuit, wherein the counter maintains a count to determine if a voltage dip detected by the voltage sensing circuit has reached the threshold voltage-dip duration.

4. The integrated circuit of claim 1, wherein the at least one power-saving performance level comprises at least one of:
   (i) a data-retaining power-saving performance level in which the supply voltage is sufficient to retain data stored in the memory array; and
   (ii) a data-loss power-saving performance level in which the supply voltage is insufficient to retain data stored in the memory array.

5. The integrated circuit of claim 1, wherein different ones of the plurality of memory performance levels have at least one of different supply voltages and different characteristic clock frequencies.

6. The integrated circuit of claim 1, wherein the voltage sensing circuit outputs the power status signal indicating one of the plurality of memory performance levels depending upon a respective threshold proportion of a full supply voltage being attained by a currently sensed voltage level.

7. The integrated circuit of claim 6, wherein the voltage sensing circuit is configured to at least one of:
   (i) output the power status signal corresponding to a full memory performance level when the currently sensed voltage level is greater than or equal to 95% of the full supply voltage;
   (ii) to output the power status signal corresponding to a power-off memory performance level when the currently sensed voltage level is less than or equal to 5% of the full supply voltage;
   (iii) to output the power status signal corresponding to a first reduced memory performance level when the currently sensed voltage level is less than 95% of the full supply voltage and greater than or equal to 80% of the full supply voltage; and
   (iv) to output the power status signal corresponding to a second reduced memory performance level when the currently sensed voltage level is less than 80% of the full supply voltage and greater than or equal to 70% of the full supply voltage.

8. The integrated circuit of claim 1, wherein the memory array comprises a plurality of SRAM memory arrays and wherein a set of voltage sensing circuits is provided for each of a respective plurality of memory array subsets, each subset comprising at least one of the plurality of SRAM memory arrays.

9. The integrated circuit of claim 8, wherein the voltage sensing circuits are integrated within corresponding ones of the memory arrays.

10. The integrated circuit of claim 1, wherein the power status feedback unit further comprises a counter connected to the voltage sensing circuit, wherein the counter maintains a count for performing sleep time control for the memory array, wherein the sleep time is a time when the memory performance level of the memory array is a sleep state corresponding to one of the at least one power-saving performance levels and wherein the counter is triggered to start counting by the power status signal and performs a count based on a predetermined minimum sleep time.

11. The integrated circuit of claim 10, wherein the power control circuit performs sleep time control by preventing a transition of the memory array between the sleep state and an operational state corresponding to one of the plurality of memory performance levels having a higher supply voltage if the counter indicates that the predetermined minimum sleep time has not yet elapsed.

12. The integrated circuit of claim 11, wherein the power control circuit is configurable to override the sleep time control to put the memory array in the operational state if a high priority access request is received.

13. The integrated circuit of claim 11, wherein the power status feedback unit further comprises a set of registers, and wherein the sleep time control depends upon a set of parameters stored in the registers and wherein at least a subset of the set of parameters is configurable.

14. The integrated circuit of claim 13, wherein the set of registers store at least one of: a maximum count value indicating a predetermined minimum sleep time; a power status value; a power level threshold value; a status ready value having one or more bits set when the counter reaches a maximum value and reset when the count is zero; and a bypass value for specifying if the counter is currently bypassed.

15. The integrated circuit of claim 10, wherein the counter is configurable to switch between counting based on a bus/system clock and counting based on a low power clock.

16. A method of controlling access to a memory in an integrated circuit, the integrated circuit including a memory, a processor, and a power management controller having a voltage sensing circuit, the method comprising:
   supplying the memory with a supply voltage corresponding to one of a plurality of memory performance levels including a full performance level and at least one power-saving performance level;
   sensing a voltage level of a memory array of the memory with the voltage sensing circuit;
   detecting, by the voltage sensing circuit, a voltage disturbance including a voltage dip of more than a predetermined minimum value, and using a counter to determine whether a duration of the voltage dip is greater than or equal to a threshold duration likely to result in data loss from memory;
   generating a power status signal for the memory array indicating one of the plurality of memory performance levels of the memory depending upon the sensed voltage level and the duration of the voltage dip; and
   permitting a memory access operation depending upon the value of the power status signal.

17. A controller for controlling access to a memory array of a memory circuit, comprising:
   a voltage sensing circuit for receiving a sensed voltage level of the memory array;
   a power management controller connected to the voltage sensing circuit for generating a power status signal indicating one of a plurality of memory performance levels of the memory circuit including a full performance level and at least one power-saving performance level, depending upon the sensed voltage level, and for permitting a memory access operation depending upon the value of the power status signal; and a counter connected to the voltage sensing circuit, wherein if the voltage sensing circuit detects a voltage disturbance including a voltage dip of more than a predetermined minimum value, then the counter, upon detection of the voltage dip, performs a count to establish whether the duration of the dip is greater than or equal to a threshold duration likely to result in data loss from memory.

* * * * *